(12) United States Patent
Ishige (10) Patent No.: US 6,396,098 B2
(45) Date of Patent: *May 28, 2002

(54) SEMICONDUCTOR MEMORY DEVICE AND METHOD OF FABRICATING THE SAME

(75) Inventor: Kiyokazu Ishige, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/866,272

(22) Filed: May 30, 1997

(30) Foreign Application Priority Data

May 30, 1996 (JP) .............................................. 8-137221

(51) Int. Cl.[7] ............................................ H01L 27/108
(52) U.S. Cl. ....................................... 257/299; 257/350
(58) Field of Search ................................ 257/299, 350, 257/351, 352, 347, 348, 349

(56) References Cited

U.S. PATENT DOCUMENTS

| 5,512,504 A | * | 4/1996 | Wolstenholme et al. ...... 437/43 |
| 5,519,239 A | * | 5/1996 | Chu ........................... 257/314 |
| 5,548,551 A | * | 8/1996 | Wang et al. ............ 365/185.18 |
| 5,691,556 A | * | 11/1997 | Saito et al. .................. 257/350 |
| 5,708,588 A | * | 1/1998 | Haddad et al. ............. 364/491 |
| 5,773,861 A | * | 6/1998 | Chen et al. .................. 257/316 |

FOREIGN PATENT DOCUMENTS

| JP | 62-150597 | 7/1987 |
| JP | 7-177729 | * 7/1995 |

* cited by examiner

*Primary Examiner*—Sara Crane
(74) *Attorney, Agent, or Firm*—Sughrue Mion, PLLC

(57) ABSTRACT

There is provided a semiconductor memory device including a semiconductor substrate, a floating gate type transistor formed on the semiconductor substrate, acting as a memory cell of the semiconductor memory device, and a charge pump circuit formed on the semiconductor substrate. The transistor includes (a) a first gate insulating film formed on the semiconductor substrate, (b) a floating gate electrode formed on the first gate insulating film, (c) a second gate insulating film formed on the floating gate electrode, and (d) a control gate electrode formed on the second gate insulating film. The charge pump circuit includes (a) a plurality of diode devices formed on a third insulating layer formed on the semiconductor substrate, and electrically connected with each other in series, and (b) a plurality of capacitors each of which is electrically connected to a terminal of each of the diode devices. The above mentioned semiconductor memory device significantly reduces a parasitic capacity to thereby enhance a step-up efficiency. Thus, it is possible to reduce power consumption in a charge pump circuit and further reduce a total area required for a semiconductor memory device.

19 Claims, 6 Drawing Sheets

SEMICONDUCTOR MEMORY DEVICE AND METHOD OF FABRICATING THE SAME

BACKGROUND OF THE INVENTION

1. Field of the Invention

The invention relates to a semiconductor memory device and a method of fabricating the same, and more particularly to a semiconductor memory device including a charge pump circuit therein and a method of fabricating the same.

2. Description of the Related Art

A conventional non-volatile semiconductor memory device such as EEPROM and a flash memory has been provided with a step-up circuit when a higher voltage than a power source voltage is to be applied to a word line of a memory cell or a drain of MOS transistor. One of such step-up circuits is a charge pump circuit.

Hereinbelow is explained a semiconductor device having a charge pump circuit with reference to FIG. 1 which is a cross-sectional view of the semiconductor device and FIGS. 2A and 2B which are equivalent circuit diagram and time chart of clock signals to be provided to the semiconductor device in operation.

Figure 1:
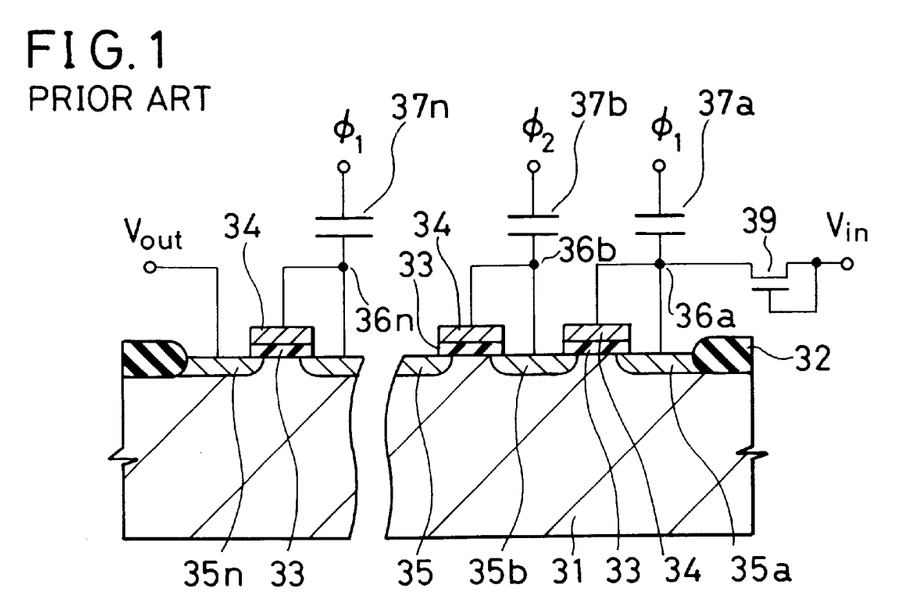
FIG. 1 is a cross-sectional view of a conventional semiconductor memory device.
Figure 2A:
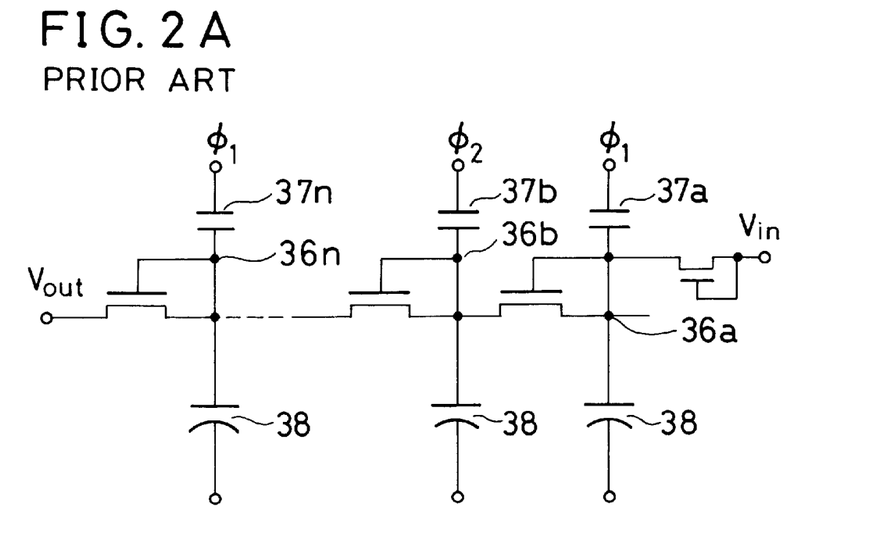
FIG. 2A is a circuit diagram of the conventional semiconductor memory device illustrated in FIG. 1.

With reference to FIG. 1, there are formed device isolation films 32 at a surface of a silicon substrate 31 in selected areas to thereby define a device formation region therebetween. A plurality of gate insulating films 33 are formed on the silicon substrate 31 in selected areas in the device formation region, and there are formed a plurality of gate electrodes 34 on the gate insulating films 33. Diffusion layers 35a to 35n are formed at a surface of the silicon substrate 31 in self-aligned fashion with the gate electrodes 34 and the device isolation films 32 being used as a mask.

Thus, a plurality of MOS transistors are formed on a surface of the silicon substrate 31. These MOS transistors are electrically connected in series to each other. Each of the gate electrodes 34 of MOS transistors is electrically connected to the associated diffusion layer 35a to 35n. Step-up capacitors 37a to 37n are electrically connected in series to connection nodes 36a to 36n, respectively, through which the gate electrode 34 is electrically connected to each of the diffusion layers 35a to 35n. As illustrated in FIG. 1, two-phase clock signals $\Phi_1$ and $\Phi_2$ are applied to every other step-up capacitor 37a, 37c, . . . or 37b, 37d, . . .

The predetermined number of MOS transistors are electrically connected in series. An input voltage Vin is input through MOS transistor 39 to the connection node 36a electrically connected to the diffusion layer 35a of a first stage MOS transistor, and an output voltage Vout is obtained through the diffusion layer 35n of a final stage MOS transistor.

The operation of the above mentioned semiconductor memory device is explained hereinbelow. As illustrated in FIG. 2A, the semiconductor memory device includes the predetermined number of MOS transistors which are electrically connected in series and in which a gate electrode and a drain are shortcircuited through the connection node 36a to 36n. A parasitic capacitor 38 is connected to each of the connection nodes 36a to 36n. The parasitic capacitor 38 comprises a junction capacity between each of the diffusion layers 35a to 35n and the silicon substrate 31, and a part of a gate capacity of the associated MOS transistor. The two-phase clock signal $\Phi_1$ or $\Phi_2$ is applied to each of the connection nodes 36a to 36n through the associated step-up capacitor 37a to 37n. Thus, the input voltage Vin is applied to the connection node 36a electrically connected to the diffusion layer 35a of the first stage MOS transistor, and the output voltage Vout is led out through the diffusion layer 35n of the final stage MOS transistor.

Figure 2B:
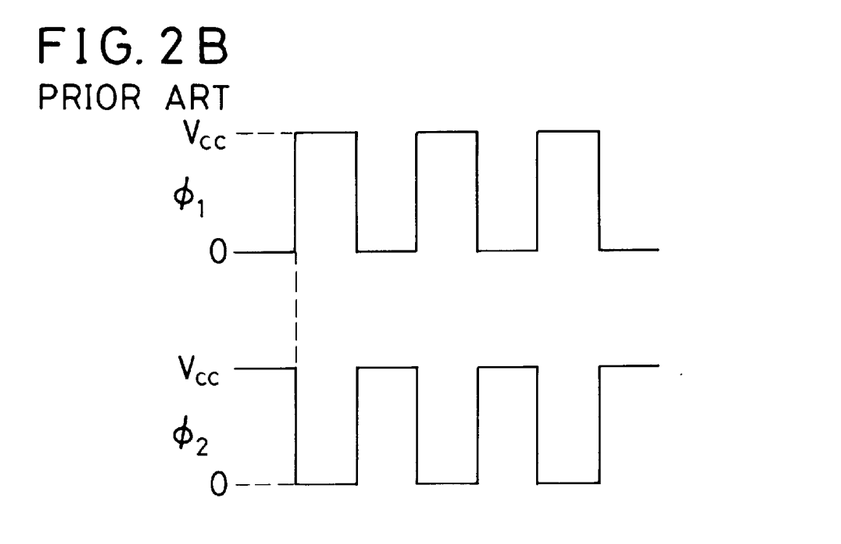
FIG. 2B is a time chart of the conventional semiconductor memory device illustrated in FIG. 1.

As illustrated in FIG. 2B, negative phase clock signals $\Phi_1$ and $\Phi_2$ are alternately applied to the step-up capacitor 37a to 37n. For instance, in steady operation of the charge pump circuit, if a clock signal $\Phi_1$ having a magnitude of Vcc is applied to the step-up capacitor 37a electrically connected to the first stage MOS transistor, a voltage at the connection node 36a of the first stage MOS transistor is increased by $\Delta V_1$ defined by the equation (A).

$$\Delta V_1 = C_1 \times Vcc/(C_1 + C_S) \tag{A}$$

In the equation (A), $C_1$ indicates a capacity of the step-up capacitor 37a to 37n, $C_S$ indicates a capacity of the parasitic capacitor 38, Vcc indicates a voltage represented by the clock signals $\Phi_1$ and $\Phi_2$. At the same time when the clock signal $\Phi_1$ is applied to the step-up capacitor 37a, a negative phase clock signal $\Phi_2$ is applied to the step-up capacitor 37b of a next stage MOS transistor. Then, a voltage at the connection node 36b is lowered, and hence electric charges of the connection node 36a of the first stage MOS transistor is transferred to the next stage MOS transistor. In a manner as mentioned above, a voltage is increased through a plurality of MOS transistors.

In the above mentioned conventional semiconductor memory device, a charge pump circuit consumes much electric power for the reason explained below. In addition, a conventional semiconductor memory device having a charge pump circuit requires much area in which the device is to be fabricated.

In a conventional semiconductor memory device, the diffusion layers 35a to 35n have a great junction capacity, which in turn increases the capacity Cs of the parasitic capacitor 38, which further in turn lowers $\Delta V_1$ as would be obvious in view of the equation (A). Accordingly, it is necessary for the step-up capacitors 37a to 37n to have a great capacity in order to a predetermined step-up in a voltage. As an alternative, it is necessary to increase the number of MOS transistor stages electrically connected in series. Thus, the above mentioned problems are posed.

The increased electric power consumption in a charge pump circuit would make it difficult to enable a semiconductor memory device to operate in a lower voltage and with lower electric power consumption.

An increased area required for forming a semiconductor memory device therein inevitably increases a chip area of a semiconductor memory device, which would make it difficult for a semiconductor memory device to have larger integration and greater capacity.

SUMMARY OF THE INVENTION

In view of the above mentioned problems in a conventional semiconductor memory device, it is an object of the present invention to provide a semiconductor memory circuit including a charge pump circuit with high step-up ability, and a method of fabricating the same.

In one aspect, there is provided a semiconductor memory device including a semiconductor substrate, a floating gate type transistor formed on the semiconductor substrate and acting as a memory cell of the semiconductor memory device, and a charge pump circuit formed on the semiconductor substrate, the transistor including (a) a first gate insulating film formed on the semiconductor substrate, (b) a floating gate electrode formed on the first gate insulating film, (c) a second gate insulating film formed on the floating gate electrode, and (d) a control gate electrode formed on the second gate insulating film, the charge pump circuit including (a) a plurality of diode devices formed on a third insulating layer formed on the semiconductor substrate, and electrically connected with each other in series, and (b) a plurality of capacitors each of which is electrically connected to a terminal of each of the diode devices.

For instance, the first gate insulating film may be a silicon dioxide film. The second gate insulating may be formed to have a multi-layered structure comprising a silicon dioxide film and a silicon nitride film. It is preferable that the floating gate electrode and the diode devices are made in a common film.

The floating gate electrode may be formed of a first silicon film formed on the first gate insulating film, and the diode devices may be constituted of pn junction diodes composed of p-type and n-type regions both formed of the first silicon film formed on the third insulating film. The first silicon film may be a thin amorphous silicon film.

It is preferable that each of the capacitors includes the p-type region as one of capacitor electrodes, a capacitor insulating film formed on the p-type region, and a second silicon film formed on the capacitor insulating film, as the other of capacitor electrodes. The second silicon film may be a polysilicon film, which preferably contains impurities therein. The second gate insulating film and the capacitor insulating film may be formed of a common insulating film.

The control gate electrode may be formed of the second silicon film. It is preferable that the n-type region has a higher impurity concentration than an impurity concentration of the p-type region. For instance, the third insulating film is a device isolation film formed on the semiconductor substrate in selected areas. The semiconductor memory device may further has a connection electrode for electrically connecting adjacent p-type and n-type regions to each other.

In another aspect, there is further provided a method of fabricating a semiconductor memory device, including the steps of (a) forming a device isolation film on a semiconductor substrate in selected areas thereof and also forming a first gate insulating film on a semiconductor substrate in a selected area thereof, (b) forming a first silicon film covering both the device isolation film and the first gate insulating film therewith, (c) converting predetermined regions of the first silicon film into p-type regions and the rest of regions into n-type regions, (d) forming a second gate insulating film covering the first silicon film therewith, (e) forming a second silicon film covering the second gate insulating film therewith, and (f) patterning the second silicon film and the second gate insulating film into a predetermined pattern.

The method may further include the step (g) of forming connection electrodes on the first silicon film for electrically connecting adjacent located p-type and n-type regions to each other.

In accordance with the above mentioned semiconductor memory device, a parasitic capacity of parasitic capacitors can be significantly reduced to thereby enhance a step-up efficiency. Thus, it is possible to reduce electric power consumption in a charge pump circuit and further reduce a total area required for a semiconductor memory device to be formed therein.

The reduction in electric power consumption of a charge pump circuit enables a semiconductor memory device to operate in a lower voltage and in lower electric power consumption. In addition, the reduction in an area required by a semiconductor memory device to be formed therein accompanies a reduction in a chip area of a semiconductor memory area, and facilitates larger integration and/or greater capacity in a semiconductor memory device.

In accordance with the above mentioned method, a semiconductor memory device having a charge pump circuit can be fabricated without so much increase in the number of steps. Thus, it is possible to prevent an increase in fabrication costs, improving cost performance.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 3:
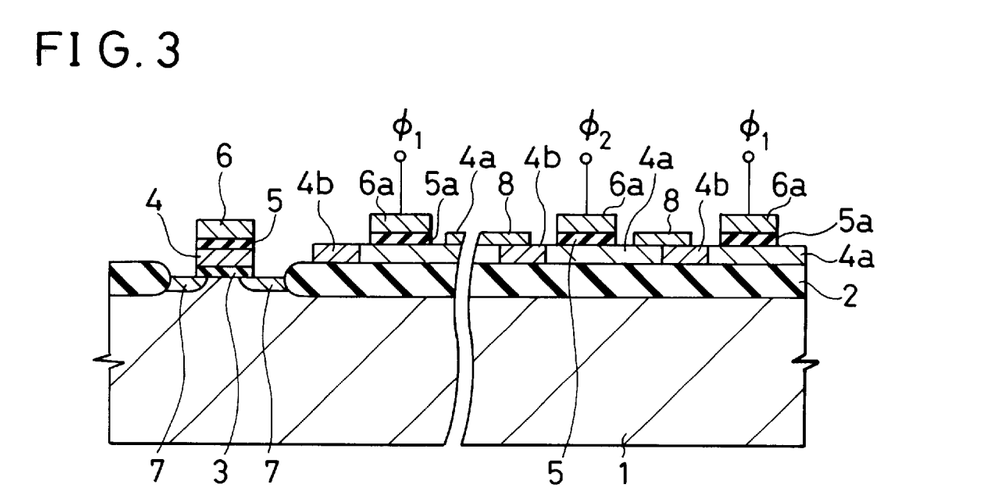
FIG. 3 is a cross-sectional view illustrating a semiconductor memory device in accordance with the first embodiment of the present invention.

The first embodiment in accordance with the present invention will be explained hereinbelow with reference to FIGS. 3, 4A and 4B. As illustrated in FIG. 3, device isolation films 2 are formed at a surface of a silicon substrate 1 in selected areas to thereby define a device formation region therebetween. A first gate insulating film 3 is formed on a surface of the silicon substrate 31 in a selected area in the device formation region, and there is formed a floating gate electrode 4 on the first gate insulating film 3. A second gate insulating film 5 and a control gate electrode 6 are formed on the floating gate electrode 4. Diffusion layers 7 are formed at a surface of the silicon substrate 1 around the first gate insulating film 3 in self-aligned fashion with the control gate electrode 6 and the device isolation films 2 being used as a mask. Thus, there is completed a floating gate type transistor on a surface of the silicon substrate 1.

In addition, a plurality of pn junction diodes and step-up capacitors are formed on the device isolation film 2. That is, there are formed a plurality of p-type silicon films 4a and n-type silicon films 4b to thereby form pn junction diodes, and there are further formed second gate insulating films 5 covering certain areas of the p-type silicon films 4a. Step-up capacitor electrodes 6a are formed on the second gate insulating films 5. As illustrated in FIG. 3, there are formed connection electrodes 8 across the pn junction diodes constituted of the adjacent n-type and p-type si licon films 4b and 4a to thereby electrically connect them to each other.

Clock signals $\Phi_1$ and $\Phi_2$ are applied to every other step-up capacitor electrode 6a. Namely, a clock signal $\Phi_1$ is applied to the step-up capacitor electrodes 6a located K-th closest to the floating gate type transistor where K is an odd number and at the same time a clock signal $\Phi_2$ is applied to the step-up capacitor electrodes 6a located J-th closest to the floating gate type transistor where J is an even number, and subsequently a clock signal $\Phi_2$ is applied to the step-up capacitor electrodes 6a located K-th closest to the floating gate type transistor where K is an odd number and at the same time a clock signal $\Phi_1$ is applied to the step-up capacitor electrodes 6a located J-th closest to the floating gate type transistor where J is an even number In the semiconductor memory device having a structure as mentioned above, the floating gate electrode 4, the p-type silicon films 4a and the n-type silicon films 4b are all formed within a common film, namely a later mentioned first silicon film. Similarly, the control gate electrode 6 of the floating gate type transistor and the step-up capacitor electrodes 6a are formed within a common layer, namely a later mentioned second silicon film.

In the instant embodiment, the floating gate type transistor is formed on the silicon substrate 1 in the device formation region, and the pn junction diodes and the step-up capacitor electrodes 6a are formed on the thick device isolation films 2.

Hereinbelow is explained the operation of the semiconductor memory device illustrated in FIG. 3 with reference to FIGS. 4A and 4B. As illustrated in FIG. 4A, the semiconductor memory device includes the predetermined number of pn junction diodes 9 electrically connected with one another. Each of the pn junction diodes 9 is constructed of the p-type silicon film 4a and the n-type silicon film 4b disposed adjacent to each other.

Figure 4A:
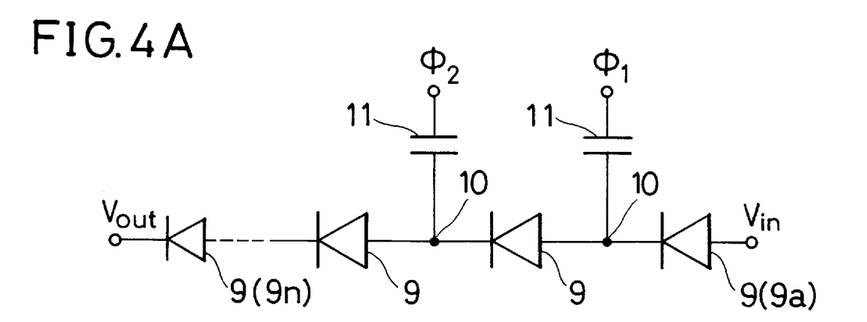
FIG. 4A is a circuit diagram of the semiconductor memory device illustrated in FIG. 3.
Figure 4B:
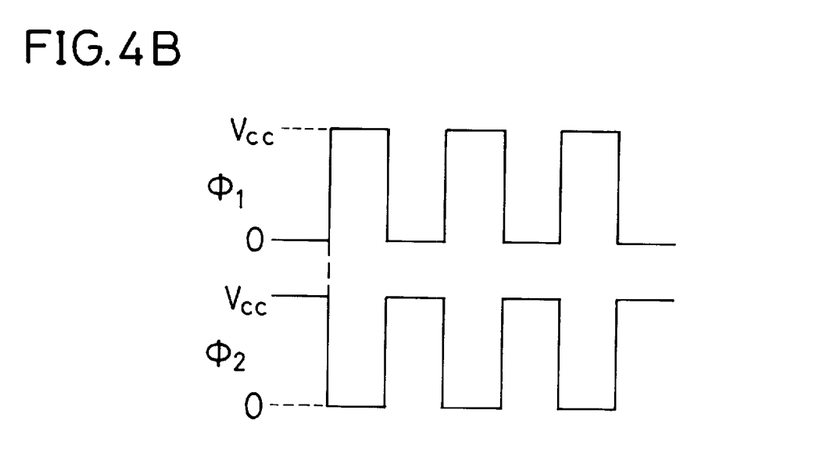
FIG. 4B is a time chart of the semiconductor memory device illustrated in FIG. 3.

A step-up capacitor 11 is electrically connected to each of nodes 10 through which the adjacent pn junction diodes 9 are electrically connected to each other, as illustrated in FIG. 4A. The step-up capacitor 11 is constructed of the p-type silicon film 4a and the step-up capacitor electrode 6a both as capacity electrodes and the second gate insulating film 5 as a capacity insulating film. As illustrated in FIG. 4A, an input voltage Vin is applied to a p-region terminal of a first stage pn junction diode 9a. An output voltage Vout is led out through an n-region terminal of a final stage pn junction diode 9n.

Two-phase clock signals are applied to the step-up capacitors 11. Specifically, as illustrated in FIG. 4B, negative phase clock signals $\Phi_1$ and $\Phi_2$ are alternately applied to each of the step-up capacitors 11. For instance, in steady condition of a charge pump circuit, if a clock signal $\Phi_1$ at a level of Vcc is applied to the step-up capacitor 11 electrically connected to the first stage pn junction diode, a voltage at an n-region terminal of the first stage pn junction diode is increased by $\Delta V_2$ defined by the following equation (B).

$$\Delta V_2 = C_1 \times Vcc/(C_1 + C_d) \tag{B}$$

In the equation (B), $C_1$ indicates a capacity of the step-up capacitor 11, and $C_d$ indicates a junction capacity of the pn junction diode. In the instant embodiment, since the pn junction diodes 9 are formed within a thin first silicon film, a pn junction area is quite small which in turn is accompanied that the junction capacity $C_d$ is quite small.

At the same time when a clock signal $\Phi_1$ is applied to the step-up capacitor 11 electrically connected to the first stage pn junction diode. a negative phase a clock signal $\Phi_2$ is applied to the step-up capacitor 11 electrically connected to a second stage pn junction diode 11. A voltage at the node 10 associated with the step-up capacitor 11 to which a clock signal $\Phi_2$ is applied is lowered, and hence electric charges accumulated at the node 10 associated with the first stage pn junction diode are transferred to the second stage pn junction diode. Thus, a voltage is gradually increased up through a plurality of the pn junction diodes.

In accordance with the inventive semiconductor memory device including a charge pump circuit having the above mentioned structure, the parasitic capacity Cd is tremendously reduced, which in turn significantly enhances a step-up efficiency of the charge pump circuit. In addition, an area for a step-up capacitor is reduced, and the required number of stages of a pn junction diode is also decreased. As a result, the semiconductor memory device can operate with significantly less electric power.

Figure 5A:
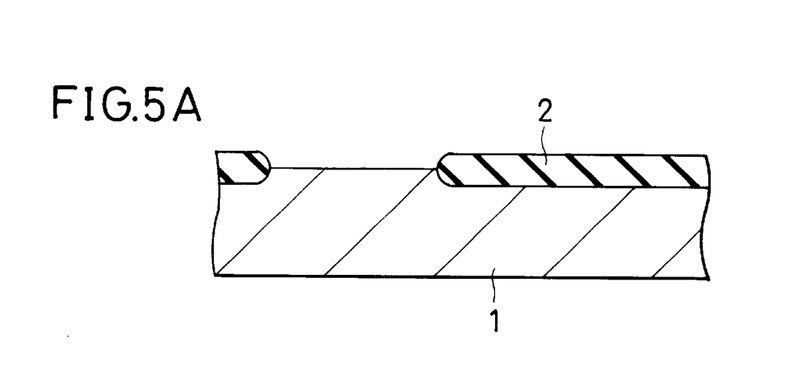
FIGS. 5A to 5H are cross-sectional views of a semiconductor memory device, illustrating respective step of a method of fabricating the same.

A method of fabricating the above mentioned semiconductor memory device is explained hereinbelow with reference to FIGS. 5A to 5H. As illustrated in FIG. 5A, device isolation films 2 are first formed at a surface of a p-type silicon substrate 1 in selected areas. The device isolation films 2 are silicon dioxide films formed by LOCOS to have a thickness of 500 nm. The device isolation films 2 defines a device formation region or active region therebetween.

Figure 5B:
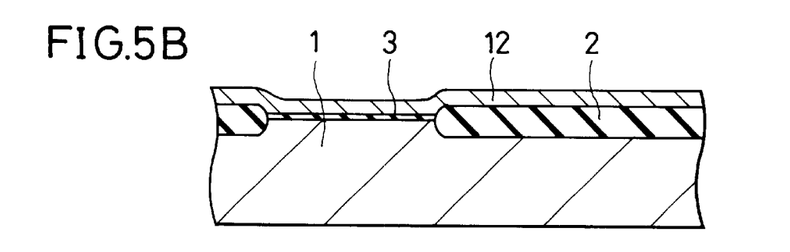

Then, as illustrated in FIG. 5B, a first gate insulating film 3 is formed at a surface of the silicon substrate 1 in the device isolation region. The first gate insulating film 3 is a silicon dioxide film formed by thermal oxidation to have a thickness of 10 nm. Then, a first silicon film 12 having p-type conductivity is formed over both the first gate insulating film 3 and the device isolation film 2. The first silicon film 12 is a thin amorphous silicon film deposited by chemical vapor deposition (CVD) and having a thickness in the range of 50 nm to 100 nm.

Figure 5C:
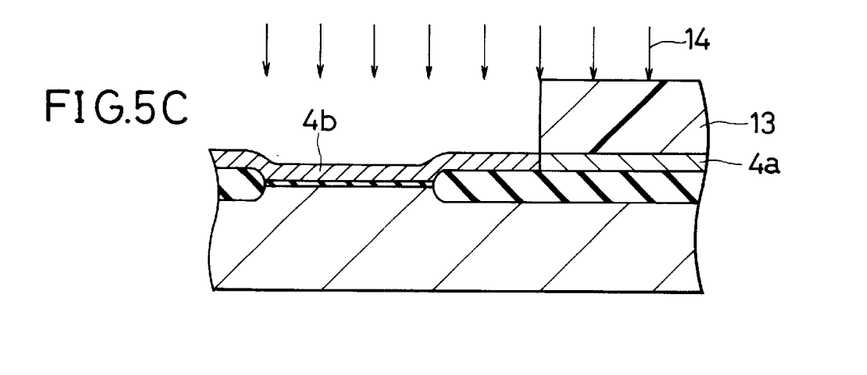

Then, as illustrated in FIG. 5C, a first photoresist mask 13 is formed on the first silicon film 12 in a certain area, followed by implantation of arsenic (As) ion 14 into the first silicon film 12 with the first photoresist mask 13 being used as a mask. Herein, the arsenic ion implantation is carried out at about 50 KeV with doses of $1 \times 10^{15}$ cm$^{-2}$. After the ion implantation, the first photoresist mask 13 is removed. Thus, there are formed a p-type silicon film 4a which used to be a portion of the first silicon film 12 located just below the first photoresist mask 13, and an n-type silicon film 4b which used to be a portion of the first silicon film 12 into which the arsenic ion 14 has been implanted with the first photoresist mask 13 being used as a mask. The arsenic ion implantation removes cores around which crystal would grow, present in the n-type silicon film 4b.

Figure 5D:
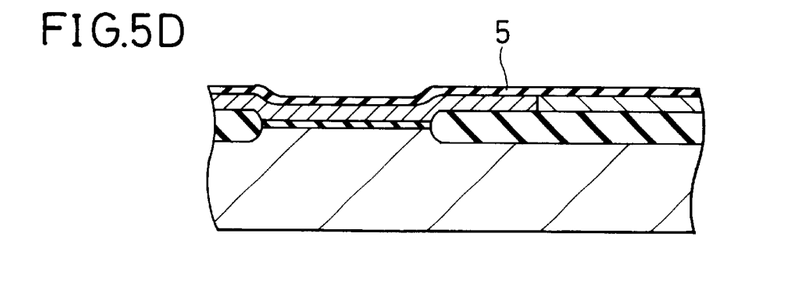

Then, as illustrated in FIG. 5D, a second gate insulating film 5 is formed all over the p-type and n-type silicon films 4a and 4b. The second gate insulating film 5 has a multi-layered structure including a thin silicon dioxide film and a thin silicon nitride film. Specifically, a silicon dioxide film is first deposited by CVD on the p-type and n-type silicon films 4a and 4b so as to have a thickness of 10 nm, and then a silicon nitride film is deposited by CVD on the silicon dioxide film so as to have a thickness of 15 nm. Then, the silicon nitride film is thermally oxidized, and thus there is formed the second gate insulating film 5.

The thin silicon dioxide film partially constituting the second gate insulating film 5 is deposited by CVD at a temperature in the range of 600° C. to 700° C. In such a range of temperature, crystallization of the amorphous first silicon film 12 is facilitated, and as a result, crystal grains grow significantly large. A temperature at which the silicon nitride film is thermally oxidized is about 900° C. The thermal oxidation temperature of 900° C. further makes crystalline of the crystallized first silicon film better. This is because the thermal oxidation does not make crystal grains grow, but make crystalline of crystal grains better.

Figure 5E:
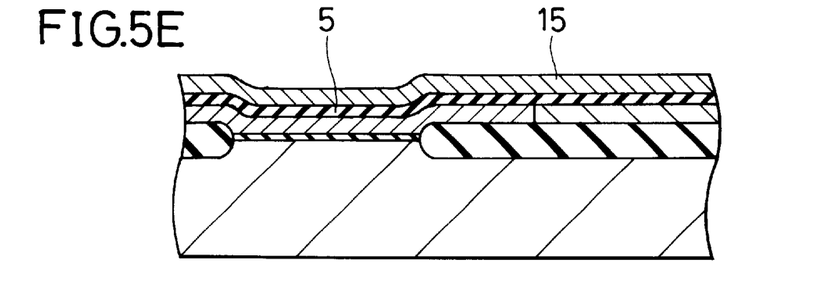

Then, as illustrated in FIG. 5E, a second silicon film 15 is formed all over the second gate insulating film 5. The second silicon film 15 is a polysilicon film formed by CVD and containing phosphorus (P) as impurities. The second silicon film 15 is designed to have a thickness of about 100 nm.

Figure 5F:
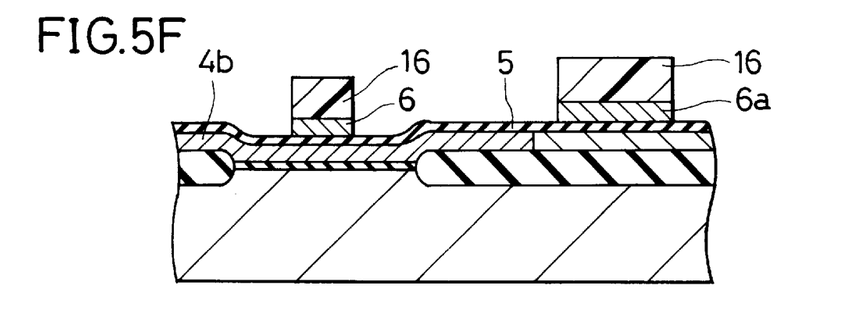

Then, as illustrated in FIG. 5F, a second photoresist mask 16 having a desired pattern is formed on the second silicon film 15. Then, the second silicon film 15 is dry-etched with the second photoresist mask 16 being used as an etching mask. Thus, there are formed a control gate electrode 6 in the active region and a step-up capacitor electrode 6a above the device isolation film 2.

Figure 5G:
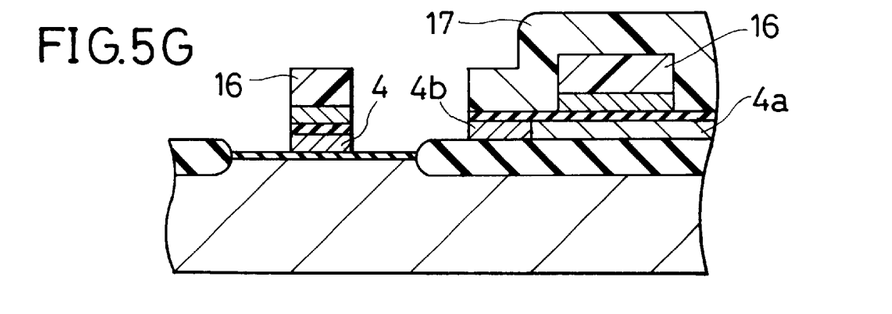

Then, as illustrated in FIG. 5G, there is formed a third photoresist mask 17 covering the p-type silicon film 4a and a part of the n-type silicon film 4b. Then, the second gate insulating film 5 is dry-etched and an area of the n-type silicon film 4b uncovered with the third photoresist mask 17 is further dry-etched with the third photoresist mask 17 and the second photoresist mask 16 being used as etching masks. After completion of the dry etching, the second and third photoresist masks 16 and 17 are removed. Thus, the floating gate electrode 4, the p-type silicon film 4a and the n-type silicon film 4b are formed in desired shapes.

Figure 5H:
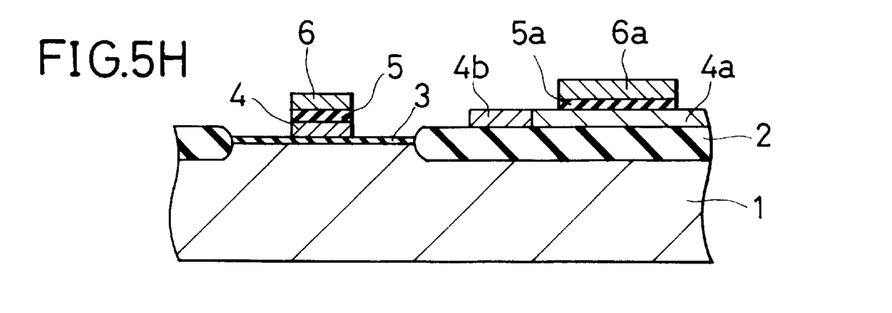

Thus, as illustrated in FIG. 5H, there is completed a floating gate type transistor on the silicon substrate 1 in the active region, which transistor is comprised of the first gate insulating film 3, the floating gate electrode 4, the second gate insulating film 5 and the floating gate electrode 6. There is further completed a pn junction diode and a step-up capacitor above the device isolation film 2, which are comprised of the p-type silicon film 4a, the n-type silicon film 4b, the second gate insulating film 5 and the step-up capacitor electrode 6a.

Then, there are formed connection electrodes 8 (see FIG. 3) across the p-type and n-type silicon films 4a and 4b for electrically connecting the p-type and n-type silicon films 4a and 4b to each other.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 8-137221 filed on May 30, 1996 including specification, claims, drawings and summary is incorporated herein by reference in its entirety.

What is claimed is:

1. A semiconductor memory device comprising: a semiconductor substrate; a floating gate type transistor formed on said semiconductor substrate, acting as a memory cell of said semiconductor memory device; and a charge pump circuit formed on said semiconductor substrate, said transistor comprising:
(a) a first gate insulating film formed on said semiconductor substrate;
(b) a floating gate electrode formed on said first gate insulating film;
(c) a second gate insulating film formed on said floating gate electrode; and
(d) a control gate electrode formed on said second gate insulating film, said charge pump circuit comprising:
(a) a plurality of diode devices including pn junction diodes comprising p-type and n-type regions, with said p-type and n-type regions being formed directly on a third insulating film of uniform thickness formed on said semiconductor substrate, and electrically connected with each other in series; and
(b) a plurality of capacitors each of which is electrically connected to a terminal of each of said diode devices.

wherein said third insulating film is formed on only a portion of said semiconductor substrate and acts to isolate said diode devices from each other.

2. The semiconductor memory device as set forth in claim 1, wherein said first gate insulating film is a silicon dioxide film.

3. The semiconductor memory device as set forth in claim 1, wherein said second gate insulating film has a multi-layered structure comprising a silicon dioxide film and a silicon nitride film.

4. The semiconductor memory device as set forth in claim 1, wherein said floating gate electrode and said diode devices are made in a common film.

5. The semiconductor memory device as set forth in claim 1, wherein said floating gate electrode is formed of a first silicon film formed on said first gate insulating film, and said diode devices are constituted of said pn junction diodes comprised of said p-type and said n-type regions both formed of said first silicon film formed on said third insulating film.

6. The semiconductor memory device as set forth in claim 5, wherein said first silicon film is a thin amorphous silicon film.

7. The semiconductor memory device as set forth in claim 5, wherein each of said capacitors comprises: said p-type region as one of capacitor electrodes; a capacitor insulating film formed on said p-type region; and a second silicon film formed on said capacitor insulating film, as the other of capacitor electrodes.

8. The semiconductor memory device as set forth in claim 7, wherein said second silicon film is a polysilicon film.

9. The semiconductor memory device as set forth in claim 8, wherein said polysilicon film contains impurities therein.

10. The semiconductor memory device as set forth in claim 7, wherein said second gate insulating film and said capacitor insulating film are formed of a common insulating film.

11. The semiconductor memory device as set forth in claim 7, wherein said control gate electrode is formed of said second silicon film.

12. The semiconductor memory device as set forth in claim 5, wherein said n-type region has a higher impurity concentration than an impurity concentration of said p-type region.

13. The semiconductor memory device as set forth in claim 5 further comprising a connection electrode for electrically connecting adjacent p-type and n-type regions to each other.

14. The semiconductor memory device as set forth in claim 1, wherein said third insulating film has a thickness of approximately 500 nm 15. A semiconductor memory device comprising: a semiconductor substrate; a floating gate type transistor formed on said semiconductor substrate, acting as a memory cell of said semiconductor memory device; and a charge pump circuit formed on said semiconductor substrate, said transistor comprising;
(a) a first gate insulating film of uniform thickness formed on said semiconductor substrate;
(b) a floating gate electrode formed on said first gate insulating film;

(c) a second gate insulating film formed on said floating gate electrode; and (d) a control gate electrode formed on said second gate insulating film, said charge pump circuit comprising:

(a) a plurality of diode devices including pn junction diodes comprising p-type and n-type regions, with said p-type and n-type regions being formed directly on a third insulating film formed over an inactive region of said semiconductor substrate, and electrically connected with each other in series; and (b) a plurality of capacitors each of which is electrically connected to a terminal of each of said diode devices;

wherein said third insulating film is formed on only a portion of said semiconductor substrate and acts to isolate said diode devices from each other and said floating gate electrode is formed of a first silicon film formed on said first gate insulating film, and said diode devices are constituted of pn junction diodes comprised of p-type and n-type regions both formed of said first silicon film formed on said third insulating film, and wherein further, each of said capacitors comprises; said p-type region as one of capacitor electrodes; a capacitor insulating film formed on said p-type region; and a second silicon film formed on said capacitor insulating film, as the other of capacitor electrodes. A method of fabricating a semiconductor memory device, comprising the steps of:

(a) forming a device isolation film on a semiconductor substrate in selected areas thereof and also forming a first gate insulating film on a semiconductor substrate in a selected area thereof;

(b) forming a first silicon film covering both said device isolation film and said first gate insulating film therewith;

(c) converting predetermined regions of said first silicon film into p-type regions and the rest of regions into n-type regions;

(d) forming a second gate insulating film covering said first silicon film therewith;

(e) forming a second silicon film covering said second gate insulating film therewith; and (f) patterning said second silicon film and said second gate insulating film into a predetermined pattern.

16. The semiconductor memory device as set forth in claim 15, wherein said second silicon film is a polysilicon film.

17. The semiconductor memory device as set forth in claim 16, wherein said polysilicon film contains impurities therein.

18. The semiconductor memory devices as set forth in claim 15, wherein said second gate insulating film and said capacitor insulating film are formed of a common insulating film.

19. The semiconductor memory devices as set forth in claim 15, wherein said control gate electrode is formed of said second silicon film.

* * * * *

UNITED STATES PATENT AND TRADEMARK OFFICE
CERTIFICATE OF CORRECTION

PATENT NO. : 6,396,098 B2  
DATED : May 28, 2002  
INVENTOR(S) : Kiyokazu Ishige

It is certified that error appears in the above-identified patent and that said Letters Patent is hereby corrected as shown below:

Column 9,
Delete lines 26 through 30, starting with "A method of fabricating"

Column 10,
Delete lines 1 to 14, ending with "film into a predetermined pattern."

Signed and Sealed this

Fifteenth Day of June, 2004

JON W. DUDAS
*Acting Director of the United States Patent and Trademark Office*